United States Patent
Hewavithana et al.

(10) Patent No.: US 8,885,775 B2
(45) Date of Patent: Nov. 11, 2014

(54) DYNAMIC OPTIMIZATION OF CARRIER RECOVERY PERFORMANCE FOR COMMUNICATION SYSTEMS

(75) Inventors: Thushara Hewavithana, Hertfordshire (GB); Bernard Arambepola, Middlesex (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,337

(22) PCT Filed: Feb. 28, 2012

(86) PCT No.: PCT/US2012/026882
§ 371 (c)(1),
(2), (4) Date: Oct. 14, 2013

(87) PCT Pub. No.: WO2013/130042
PCT Pub. Date: Sep. 6, 2013

(65) Prior Publication Data
US 2014/0029708 A1    Jan. 30, 2014

(51) Int. Cl.
*H03D 3/18* (2006.01)
*H03D 3/24* (2006.01)
*H04L 27/227* (2006.01)
*H04L 7/04* (2006.01)
*H03L 7/08* (2006.01)
*H04L 7/033* (2006.01)

(52) U.S. Cl.
CPC .......... *H04L 7/0331* (2013.01); *H04L 27/2271* (2013.01); *H04L 7/04* (2013.01); *H03L 7/08* (2013.01)
USPC .......... 375/327; 375/316; 375/324; 375/326; 375/340; 375/375; 375/376

(58) Field of Classification Search
CPC .................. H04L 27/2647; H04L 2027/0067; H04L 2027/0057; H04L 27/2332; H04L 25/067; H04L 1/0045; H04L 7/033; H03L 7/0891; H03L 7/087
USPC .......... 375/316, 326, 327, 324, 375, 376, 340
See application file for complete search history.

(56) References Cited

U.S. PATENT DOCUMENTS 5,796,535 A * 8/1998 Tuttle et al. ...................... 360/51
5,966,258 A * 10/1999 Bliss ............................... 360/46

(Continued)

OTHER PUBLICATIONS

International Search Report, PCT/ISA/210, Nov. 23, 2012, total of 4 sheets.

(Continued)

*Primary Examiner* — Ted Wang
(74) *Attorney, Agent, or Firm* — Pillsbury Winthrop Shaw Pittman LLP (57) ABSTRACT

Apparatuses, systems, and methods are directed to maintaining optimal carrier tracking performance in view of operating conditions that prevail. Such configurations employ a phase lock loop that configured to generate an estimated phase error value, a variance module configured to calculate a phase noise variance based on the estimated phase error value, and a loop control bandwidth module that calculates a loop bandwidth value based on a detected lower phase noise variance, generates modified loop filter values in accordance with the calculated loop bandwidth value, and updates the phase lock loop with the modified loop filter values. During subsequent iterations, the modified loop filter values are incrementally adjusted along a particular direction until the phase noise variance increases at which point the modified loop filter values are incrementally adjusted in an opposite direction to converge on an optimal loop bandwidth value.

19 Claims, 4 Drawing Sheets

(56) References Cited

U.S. PATENT DOCUMENTS

| | | | |
|---|---|---|---|
| 6,108,151 A * | 8/2000 | Tuttle et al. | 360/51 |
| 6,249,180 B1 | 6/2001 | Maalej et al. | |
| 6,646,822 B1 * | 11/2003 | Tuttle et al. | 360/46 |
| 7,317,419 B2 | 1/2008 | Sugar et al. | |
| 2003/0053564 A1 | 3/2003 | Kim et al. | |
| 2005/0157820 A1 | 7/2005 | Wongwirawat et al. | |
| 2005/0169418 A1 | 8/2005 | Valtolina et al. | |
| 2008/0018521 A1 | 1/2008 | Sahinoglu et al. | |
| 2010/0304761 A1 | 12/2010 | Seibert et al. | |

OTHER PUBLICATIONS

International Preliminary Report on Patentability, mail date Sep. 12, 2014.

* cited by examiner

DYNAMIC OPTIMIZATION OF CARRIER RECOVERY PERFORMANCE FOR COMMUNICATION SYSTEMS

TECHNICAL FIELD

This disclosure relates generally to the field of communication systems, and in particular, to a method and apparatus for optimizing carrier recovery performance in communication systems.

BACKGROUND ART

In modern communication systems, data may be processed at a transmitting device, modulated, filtered, amplified, and transmitted to one or more receiving devices. The transmitted signal typically experiences path loss, multipath interference, and other types of signal degradation before reaching the receiving devices. A receiving device receives the modulated signal, performs various types of conditioning, and demodulates the conditioned signal to recover the transmitted data.

In demodulating the received signal, receiving devices often employ a carrier-recovery loop to remove frequency and phase variations that may exist between the transmitting device oscillator and receiving device oscillator. The carrier-recovery loop typically incorporates a phase-locked loop (PLL) to track and remove the frequency and phase variations. Generally, the loop bandwidths of the PLLs are optimized for peak performance. Such optimization may define operations based on an assumed signal-to-noise ratio (SNR) and/or phase noise power spectral density (PSD).

However, in addition to the signal degradations that occur along the channel, certain receiver components may also contribute to frequency and phase variations. As such, the actual phase noise PSD may well be different from the assumed phase noise PSD—just as the actual operating SNR may be different from the assumed SNR. Such variances may not be stationary and may, therefore, compromise carrier recovery performance.

DETAILED DESCRIPTION

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, what is proposed is the dynamic adaptation of a communication receiver phase lock loop that maintains optimal performance regardless of channel SNR, phase noise statistics, and other operating conditions that prevail. The disclosed embodiments provide for apparatuses, systems, and methods that employ a phase lock loop configuration to generate an estimated phase error value based on a received data signal and a reference oscillator reference signal, a variance module configured to calculate a phase noise variance based on the estimated phase error value, and a loop bandwidth control module. Upon determining that the calculated phase noise variance is lower than a previously saved phase noise variance, the loop control bandwidth module sets the lower phase noise variance as the saved noise variance, calculates a loop bandwidth value based on the saved, lower phase noise variance, initiates small adjustments to loop filter values along an adjustment direction (positive or negative incremental adjustments) to generate modified loop filter values in accordance with the calculated loop bandwidth value. The loop bandwidth control module then updates the phase lock loop with the modified loop filter values. During subsequent iterations, if it is determined that a then-calculated phase noise variance is greater than a previously saved phase noise variance, the loop bandwidth control module changes the adjustment direction of the modified loop filter values and updates the phase lock loop with the then-modified loop filter values to converge onto a loop bandwidth value that maintains optimal performance regardless of the operating conditions that prevail.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

Figure 1:
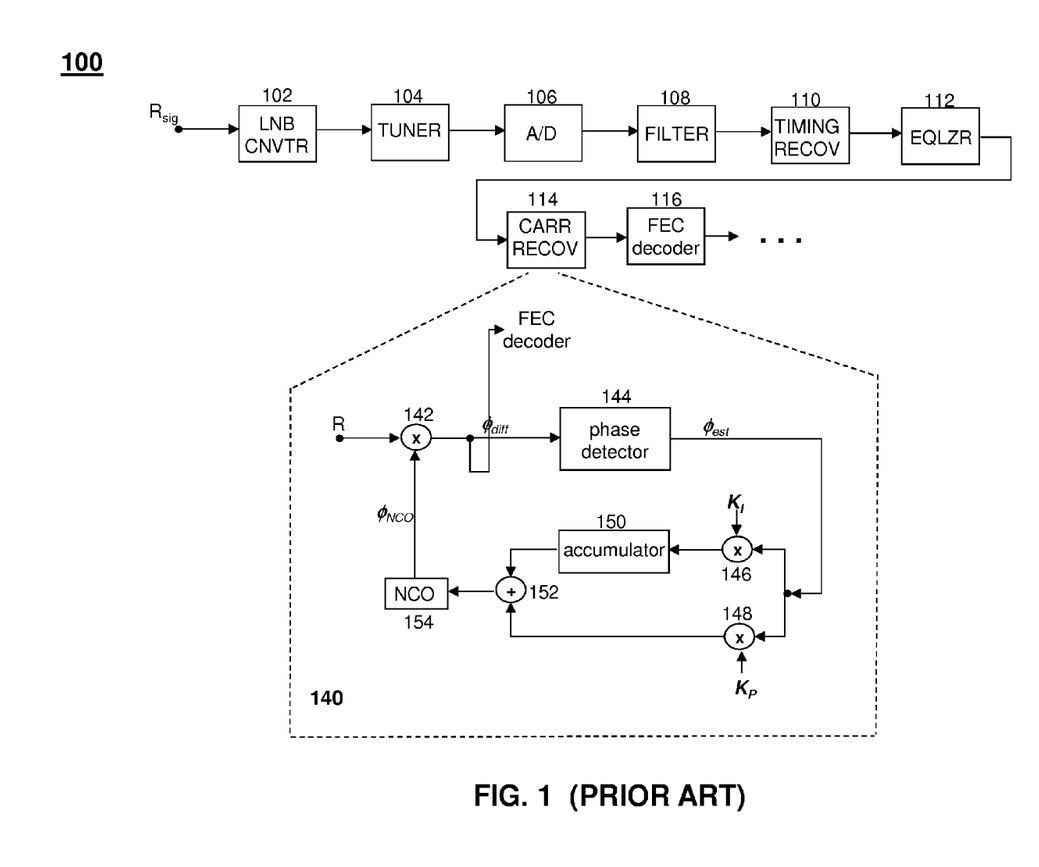
FIG. 1 depicts a high-level functional block diagram of a conventional wireless communication receiver system.

By way of review, FIG. 1 depicts a high-level functional block diagram of a conventional wireless communication (e.g., cellular, satellite, microwave point-to-point, etc.) receiver system 100. Although a wireless communication system is depicted for the purposes of background, it will be appreciated that the principles disclosed herein are not, in any way, limited to wireless communication systems, as such principles apply with equal force to wireline communication systems.

As shown, communication receiver system 100 may include a variety of components along the receiver chain, such as, for example, low noise block converter (LNB) 102, tuner 104, analog-to-digital (A/D) converter 106, filter 108, timing recovery circuitry 110, equalizer 112, carrier recovery circuitry 114, and forward error correction (FEC) decoder 116.

Typically, communication receiver system 100 receives a radio-frequency (RF) receive signal $R_{sig}$ at the front end of the receiver chain where it is supplied to LNB 102. LNB 102 includes a local oscillator to down-convert the RF receive signal $R_{sig}$ into signals having one or more intermediate frequencies (IF). These IF signals may then be supplied to tuner 104 which allows signals having frequencies of interest to pass through while filtering out undesirable IF signals (e.g., unwanted channels and intermodulation cross-products) in order to provide baseband signals having complex signal components (e.g., in-phase and quadrature-phase components). The A/D converter 106 may then convert baseband signals into digital component signals, which are then further filtered by filter 108. The filter in tuner 104 has to be good enough to prevent anti-aliasing due to sampling in A/D converter 106, but further filtering may be required in the digital domain to isolate the wanted channel which may have a narrower bandwidth than the tuner filter.

The filtered digital component signals are then supplied to a timing recovery circuit 110 that may comprise circuits configured to extract sampling frequency information and reproduce or recreate the transmitter sampling clock frequency to generate digital component signals R at the symbol rate level $R_s$. The digital component R signals may then be supplied to equalizer 112 to compensate for channel effects (e.g., intersymbol interference, group delays, etc.)

The equalized digital component signals R will then be supplied to carrier recovery circuitry 114 to estimate and compensate for the phase differences (i.e. phase errors) in the R signals carrier component. In particular, carrier recovery circuitry 114 may incorporate a second order phase locked loop (PLL) 140, as depicted in FIG. 1. PLL 140 receives the digital component signals R which are inputted to phase rotator 142 and mixed with a reference signal outputted from numerically-controlled oscillator (NCO) 144. The NCO 144 reference signal is complex exponential signal with a phase angle value $\phi_{NCO}$. It will be appreciated that while the oscillator of PLL 140 is represented is an NCO that may be employed in a variety of digital system embodiments, other embodiments may comprise a voltage-controlled oscillator, such as in embodiments which are mixed analog/digital systems.

The output of phase rotator 142, namely the result of mixing the digital component signals R with the complex reference signal having phase angle value $\phi_{NCO}$, generates a complex signal comprising a phase difference $\phi_{diff}$ between the digital component signals R and NCO 144 phase value $\phi_{NCO}$. This complex signal is then supplied to phase detector 144, which generates an estimated phase error $\phi_{est}$ that may be used as a phase tracking parameter.

That is, the estimated phase error signal $\phi_{est}$ is inputted, in parallel, to an integral filter branch having a filter gain coefficient $K_I$ and a proportional filter branch having a filter gain coefficient $K_P$. The integral branch multiplies the estimated phase error signal $\phi_{est}$ by integral gain coefficient $K_I$, at multiplier 146, and then forwards the $K_I$ estimated phase error signal to accumulator 150 to integrate a number of phase error samples to retain any frequency offsets that are compensated by the loop. In parallel operation, the proportional branch multiplies, at multiplier 148, the estimated phase error signal $\phi_{est}$ by proportional gain coefficient $K_P$. It will be appreciated that coefficients $K_I$, $K_P$ used for the integral and proportional filter branches determine the loop impulse and frequency responses.

The accumulated $K_I$ estimated phase error signal and proportional $K_P$ estimated phase error signal are subsequently combined, via combiner 152, and the result is inputted to NCO 154. In turn, NCO 154 generates the complex reference signal having phase angle value $\phi_{NCO}$ based on the combined $K_I$ and $K_P$ estimated phase error signals.

With this said, it will be appreciated that for satisfactory performance, the loop bandwidth of the PLL is optimized to minimize overall noise in the loop as well as cycle slips. Typically, noise comprises two components, additive white Gaussian thermal noise and phase noise introduced by oscillating components in the system, such as, LNB 102 and tuner 104. For example, increasing the loop bandwidth may result in a quicker convergence and allow the tracking of the phase variations to reduce the contribution of the phase noise component. However, larger loop bandwidths do not assist in filtering out the additive white Gaussian noise. Conversely, decreasing the loop bandwidth decreases the Gaussian noise component but also reduces the ability of the PLL to track out the phase noise. In practice, the loop bandwidth is typically optimized by selecting fixed gain coefficients $K_I$, $K_P$ for an assumed operating signal-to-additive noise power level (e.g. SNR) as well as the assumed phase noise power spectral density (PSD) characteristics.

However, at any given time, the actual operating SNR and phase noise PSD may deviate from the assumed operating SNR and phase noise PSD due to, for example, transmission channel media anomalies. In addition, components of the receiver chain themselves, whether in a wireless or wireline communication system, may also introduce spurious phase variations. For example, such phase variations may stem from local oscillating elements in the receiver components that are sensitive to temperature fluctuations. As such, these phase variations may contribute to the overall phase noise that may not be statistically stationary, thereby compromising the performance of the PLL and increasing the bit error rate (BER) of the receiver.

In overcoming such issues to achieve optimal tracking performance in view of the actual operating conditions that prevail, it is first noted, by way of review, that the power spectral density of oscillator phase noise may be theoretically modeled as $K_{phase\_noise}/f_3$, which in practice typically provides a slope of approximately −25 dB/decade of frequency. Based on this assumption, the variance of loop phase noise may be represented by equation (1), as follows:

$$\sigma_\phi^2 = \frac{\omega_n}{SNR} f_1(\zeta) + \frac{K_{phase\_noise}}{\omega_n^2} f_2(\zeta) \qquad (1)$$

where $\omega_n$ is the loop natural frequency and $\xi$ is damping factor representative of loop settling time. Because loop bandwidth is linearly proportional to the loop natural frequency for a given damping factor $\xi$, for the sake of convenience, $\omega_n$ will be referred to as the loop bandwidth for the remainder of the text.

Because, in practice, the damping factor $\xi$ is usually held close to or just higher than the critical damping value, the two functions $f_1(\xi)$ and $f_2(\xi)$ of equation (1) may be treated constants. This indicates that there are two contributions to the phase noise variance, in which the first term (i.e., $f_1(\xi)$ term) is inversely proportional to the SNR and the second term (i.e., $f_2(\xi)$ term) is directly proportional to phase noise. Moreover, with regard to the loop bandwidth $\omega_n$, the first term increases linearly with $\omega_n$ while the second term decreases with the square of $\omega_n$. Thus, the optimum loop bandwidth $\omega_n$ that minimizes the phase noise variance may be theoretically obtained by differentiating equation (1) with respect to $\omega_n$.

Figure 2:
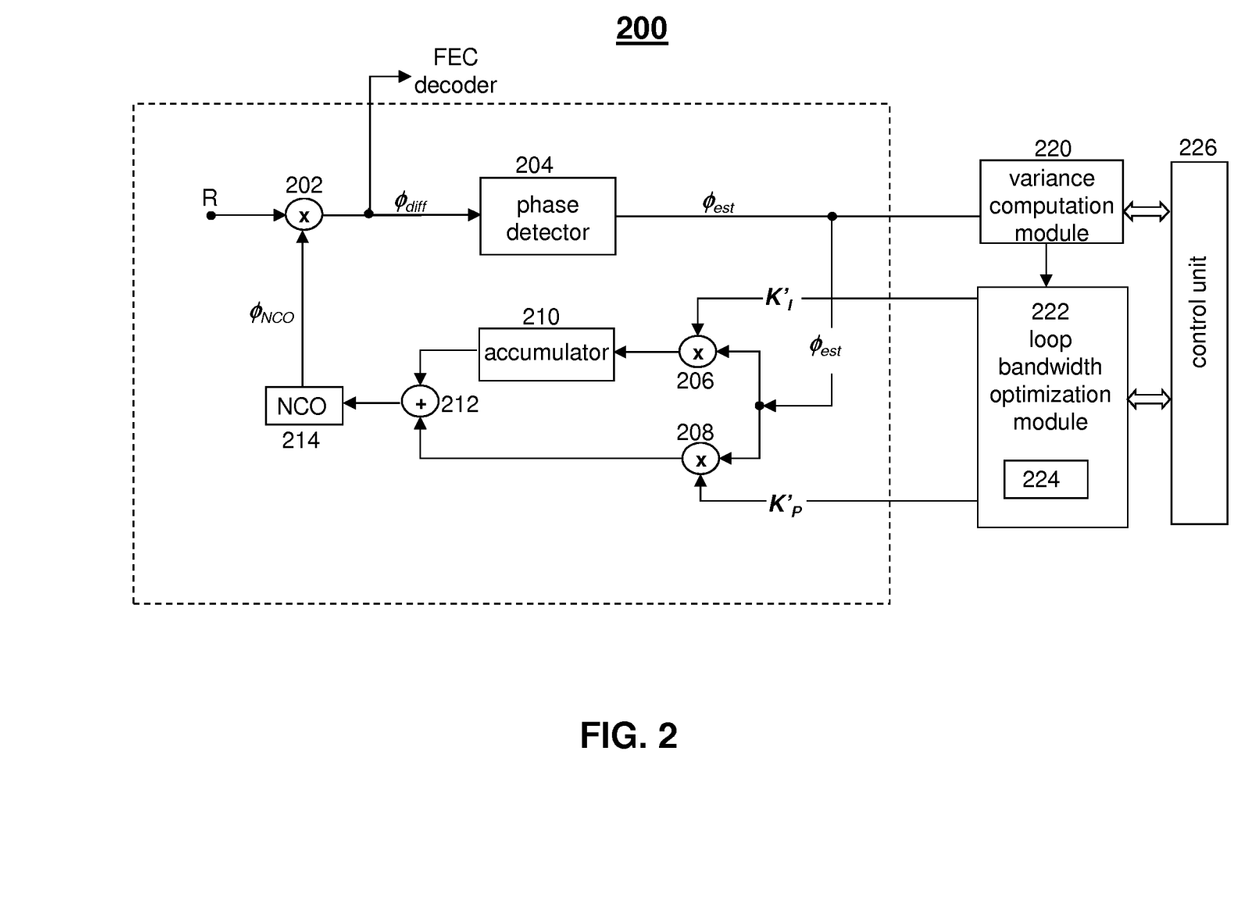
FIG. 2 depicts a high-level functional block diagram of an adaptive phase locked loop implementation that maintains optimal tracking performance, in accordance with various aspects of the present disclosure.

After some mathematical manipulations and derivations, the loop bandwidth $\omega_n$ and damping factor $\xi$ may be represented by equations (2), (3), as follows:

$$\omega_n = R_S \sqrt{K_{PED} K_I} \qquad (2)$$

$$\zeta = \frac{K_P \sqrt{K_{PED}}}{2\sqrt{K_I}} \quad (3)$$

where $K_{PED}$ is the gain of the phase error detector and $K_P$ and $K_I$ are the gain coefficients of the proportional and integral filters of PLL 200.

Referring to equation (2), the loop bandwidth $\omega_n$ may be controlled by manipulating the integral gain coefficient $K_I$, as a small adjustment $\delta K_I$ of $K_I$ will lead to a small adjustment of the loop bandwidth $\omega_n$. However, in order to keep the loop damping factor $\xi$ constant, a small adjustment $\delta K_P$ to proportional gain coefficient $K_P$ is also made. These two small adjustments are related through equation (4), as follows:

$$\delta K_P = \frac{K_P}{2K_I} \delta K_I \quad (4)$$

Based on the observations, empirical assumptions, and mathematical modeling of the various parameters, as noted above, FIG. 3 depicts a flowchart of process 300, in accordance with various aspects of the present disclosure. Process 300 is directed to maintaining optimal tracking performance in view of the actual operating conditions that prevail, including non-stationary phase noise statistics. In conjunction, with process 300, FIG. 2 depicts a high-level functional block diagram of an illustrative, non-limiting example of an implementation of adaptive PLL 200, in accordance with various aspects of the present disclosure. In this non-limiting implementation example, adaptive PLL 200 may embody the operations of process 300, as discussed below.

It will be appreciated that, in some embodiments, process 300 and adaptive PLL 200 may be implemented in hardware, software, and/or firmware, and may also run on special purpose or general purpose computing platforms. The execution and control of various aspects may be implemented via one or more microprocessors or microcontrollers such as those made by Intel Corporation of Santa Clara, Calif. (although other vendors may be used). In certain embodiments, given high throughput requirements of certain communication systems, process 300 and adaptive PLL 200 may run on more dedicated on-chip computing engines containing specialist signal processing building blocks such as FFTs and complex number arithmetic.

In other embodiments, process 300 and adaptive PLL 200 may be implemented machine readable instructions for executing the various operations noted above. The machine readable instructions may be implemented in software stored on tangible computer readable media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or implemented in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, or the like).

In yet other embodiments, in which the communication receiver is implemented in hardware, process 300 and adaptive PLL 200 may be implemented in association with firmware drivers and register maps of this hardware. For example, there may be registers to control the carrier recovery loop parameters in accordance with process 300 along with other registers to read-out the updated settings. Furthermore, parameter updates may be part of the firmware code implemented by a control micro-controller.

Returning to FIG. 3, process 300 may be invoked periodically or in response to the detection of unsatisfactory carrier recovery performance based on a minimum performance threshold metric. Upon invocation, process 300 begins at block 302, which sets the initial conditions such that the saved noise variance $\sigma^2_\phi$ is set to a very large value (e.g., infinity) and an adjustment direction change counter to 0. As depicted in FIG. 2, direction change counter 224, which is associated with loop bandwidth module 222, is configured to record how many directional changes occur during a convergent approach to the optimal loop bandwidth. Direction change counter 224 may be constrained to a threshold value representative of a certain confidence level in convergence performance.

Figure 3:
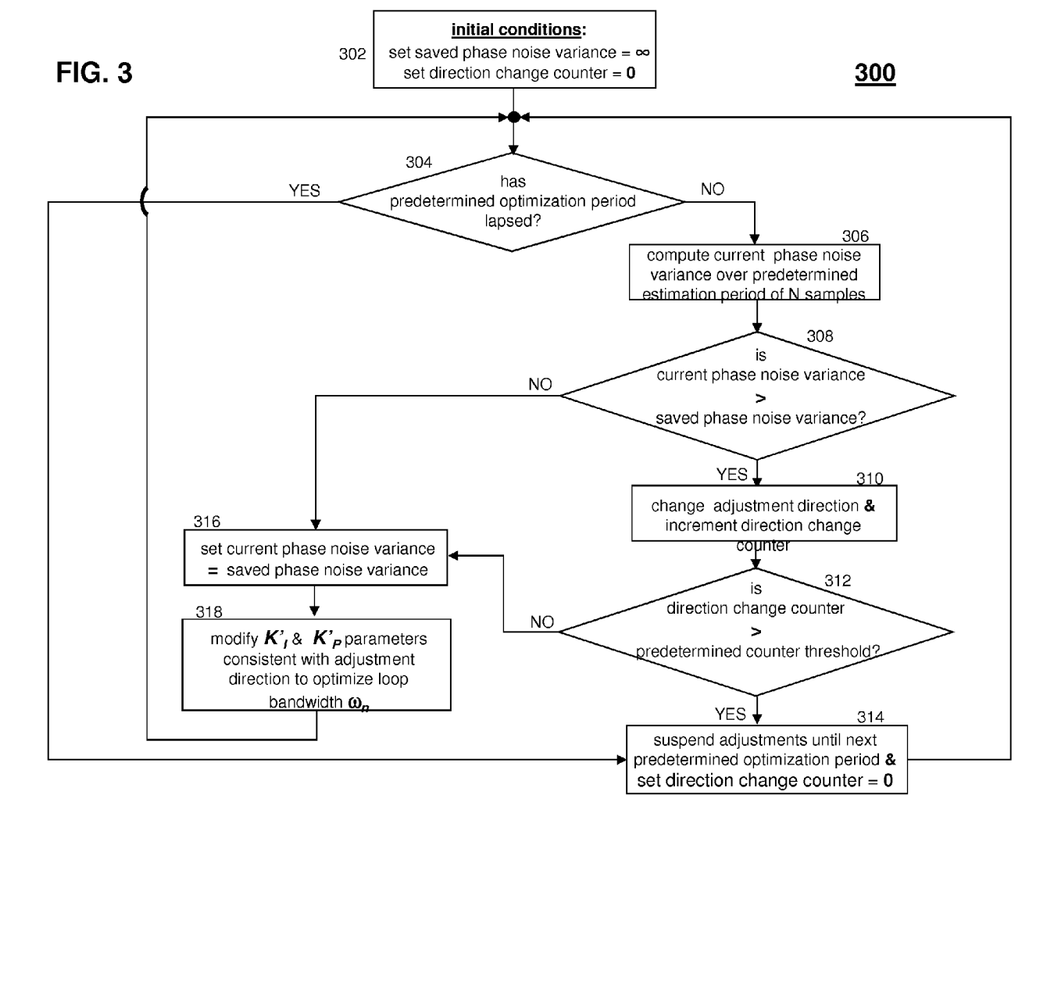
FIG. 3 depicts a functional flow diagram of a process for maintaining optimal tracking performance, in accordance with various aspects of the present disclosure.

After setting the initial conditions, process 300 proceeds block 304 to determine whether the optimization period has lapsed. The optimization period may be defined for a predetermined interval of time that, again, assures a certain level of confidence in convergence performance. Such confidence levels may be based on empirical experiences and/or theoretical estimations. If the optimization period has lapsed, process 300 suspends any further adjustments until the next optimization period is triggered and resets direction change counter 224 to 0, as indicated by block 314.

If the optimization period has not lapsed, process 300 advances to block 306, in which the phase noise variance is calculated at that instant, based on an estimated phase error signal $\phi_{est}$. In one non-limiting example, as depicted in FIG. 2, phase noise variance computation module 220 receives estimated phase error $\phi_{est}$ from phase detector 204. Phase noise variance computation module 220 may be in communication with a control unit 226 and is configured to compute the corresponding phase noise variance $\sigma^2_\phi$ over a specified period of N samples. It is be noted that the phase noise variance given by equation (1) has been obtained by assuming that the phase noise power spectral density as a function of frequency may be theoretically characterized as $K_{phase\_noise}/f^3$. However, the actual phase noise power spectral density may well be different from that. Therefore, the actual phase noise variance $\sigma^2_\phi$ is derived from the measured phase error estimate $\phi_{est}$ using $$\sigma^2_\phi = \frac{1}{N}\sum_{i=i}^{N}(\phi_{est}(i) - \overline{\phi_{est}})^2$$

where $\phi_{est}(i)$ is one sample of the phase error estimate and $\overline{\phi_{est}}$ is the mean value of the phase error which is zero for an unbiased phase error detector.

At block 308, process 300 then determines whether currently calculated phase noise variance $\sigma^2_\phi$ is greater than the saved noise variance value. By way of illustration, once phase noise variance computation module 220 calculates the actual phase noise variance $\sigma^2_\phi$, the loop bandwidth optimization module 222, in association with communication with control unit 226 as shown in FIG. 2, is configured to achieve the optimal loop bandwidth $\omega_n$ for the prevailing conditions, by adjusting the integral filter gain coefficient $K_I$ and proportional filter gain coefficient $K_P$ which control loop bandwidth $\omega_n$.

In particular, loop bandwidth optimization module 222 may operate to apply a small perturbation in the system by introducing a small positive or negative change in $K_I$ and $K_P$. In one embodiment, for example, loop bandwidth optimization module 222 may introduce a positive incremental adjustment in coefficient $K_I$ such that $K'_I \rightarrow K_I + \delta K_I$. And, consistent with equation (4), the small positive adjustment of $K_I$ results in a corresponding positive incremental adjustment of coefficient $K_P$ such that $K'_P \rightarrow K_P(1+\delta K_I/2K_I)$. It will be appreciated that loop bandwidth optimization module 222 may equally initially introduce a negative incremental adjustment in coefficients $K_I$ and $K_P$, such that $K'_I \rightarrow K_I - \delta K_I$ and commensurately, $K'_P \rightarrow K_P(1-\delta K_I/2K_I)$.

As shown in FIG. 2, loop bandwidth optimization module 222 forwards the adjusted integral gain coefficient $K'_I$ to multiplier 206 where it is multiplied with the estimated phase error signal $\phi_{est}$ and then integrated by accumulator 210. Similarly, the adjusted proportional gain coefficient $K'_P$ is forwarded to multiplier 208 where it is also multiplied by the estimated phase error signal $\phi_{est}$. The accumulated $K'_I$ estimated phase error signal and proportional $K'_P$ estimated phase error signal are subsequently combined, via combiner 212, and the result is inputted to NCO 214, which in turn, generates the complex exponential reference signal with phase angle value $\sigma_{NCO}$.

Returning to block 308, if process 300 determines that the currently calculated phase noise variance $\sigma^2_\phi$ is less than the saved noise variance value, process 300 advances to block 316 where the current phase noise variance value is set as the saved phase noise variance value. Process 300 then progresses to block 318 which modifies the $K'_I$ and $K'_P$ gain coefficients in accordance with the adjustment direction such as, for example, conducting positive incremental adjustments $K'_I \rightarrow K_I + \delta K_I$, and $K'_P \rightarrow K_P(1+\delta K_I/2K_I)$.

For subsequent iterations, assuming that the optimization period has not lapsed and direction change counter 224 has not exceeded its threshold, phase noise variance computation module 220 continues to recalculate the corresponding phase noise variance $\sigma^2_\phi$ given the modified the $K'_I$ and $K'_P$ gain coefficients and if the recalculated phase noise variance $\sigma^2_\phi$ continue to be less than the previously computed phase noise variance $\sigma^2_\phi$, the loop bandwidth optimization module 222 continues to initiate small incremental positive adjustments in coefficients $K'_I$ and $K'_P$, as noted above, until such an instant where the noise variance $\sigma^2_\phi$ increases. It is noted that once the $K'_I$ and $K'_P$ gain coefficients are modified a small time period is allowed for the system to settle before calculating the phase noise variance over another period of N samples.

Upon process 300 determining, at any point, that a currently calculated phase noise variance $\sigma^2_\phi$ is greater than the previously saved noise variance value, as queried by block 308, process 300 then changes the adjustment direction of coefficients $K'_I$ and $K'_P$ for the next iteration, at block 310, namely, from a positive incremental change (e.g., $K'_I \rightarrow K_I + \delta K_I$, and $K'_P \rightarrow K_P(1+\delta K_I/2K_I)$) to a negative incremental change (e.g., $K'_I \rightarrow K_I - \delta K_I$ and $K'_P \rightarrow K_P(1-\delta K_I/2K_I)$). This is because an increase in phase noise variance $\sigma^2_\phi$ indicates that the loop bandwidth $\omega_n$ has been adjusted too far in a particular direction (e.g., in the illustrated case, along the positive direction) and crossed over an optimum bandwidth value for the prevailing conditions. In order to converge on the optimum bandwidth value, loop bandwidth optimization module 222 changes the adjustment direction by initiating small adjustments for coefficients $K_I$ and $K_P$ in the opposite direction (e.g., $K'_I \rightarrow K_I - \delta K_I$ and $K'_P \rightarrow K_P(1-\delta K_I/2K_I)$). Block 310 also increments direction change counter 224.

So, if at block 312, direction change counter 224 is greater than the preset counter threshold, process 300 advances to block 314 where process 300 suspends any further adjustments until the next optimization period is triggered and resets direction change counter 224 to 0.

If, on the other hand, direction change counter 224 is less than the preset counter threshold, process 300 advances to block 316, where loop bandwidth optimization module 222 continues to initiate negative incremental changes in coefficients $K'_I$ and $K'_P$, as noted above, for subsequent iterations while the optimization period has not lapsed and direction change counter 224 has not exceeded its threshold.

During subsequent iterations, if process 300 determines that noise variance $\sigma^2_\phi$ has increased which, again, indicates that the loop bandwidth $\omega_n$ has crossed over the optimum bandwidth value, process 300 changes the adjustment direction and increments the adjustment direction change counter 224, as discussed above relative to block 310.

It will be appreciated that as process 300 converges on the optimum bandwidth value for the conditions that exist, the changes in adjustment direction may toggle back and forth, increasing the count in adjustment direction change counter 224. As such, the threshold value for adjustment direction counter may be selected to ensure a certain convergence confidence level.

In this manner, process 300 is configured to consistently find the optimum operating point for carrier recovery loop to provide best receiver performance, given the actual conditions that exist. In other words, process 300 automatically adapts the carrier recovery loop to provide the best performance whatever the thermal noise and phase noise are at the receiver input, without making any assumptions regarding the statistical properties of these noise sources. It should also be appreciated that the optimum loop parameters are functions of the symbol rate (see, equations (2) and (3) above). Hence, process 300 will automatically optimize the receiver for any chosen symbol rate as well. In fact, phase noise issues are more severe for low symbol rates, such as those used in mobile receivers than for high symbol usually employed for static in-house reception. Furthermore, if the noise statistics change over time (say due to a temperature drift or due to a change in signal strength caused by cloud cover) the process 300 will ensure re-optimization.

It will be appreciated that, although process 300 optimizes carrier recovery performance with respect to $\omega_n$, process 300 may be extended to provide a two-dimensional optimization scheme, such as, for example, optimizing carrier performance with respect to $\omega_n$ and $\xi$. It will also be appreciated that process has been optimized with respect to the phase noise variance, process 300 may be generalized to adopt other metrics for optimization, such as, for example, bit error rate, SNR, etc.

Figure 4:
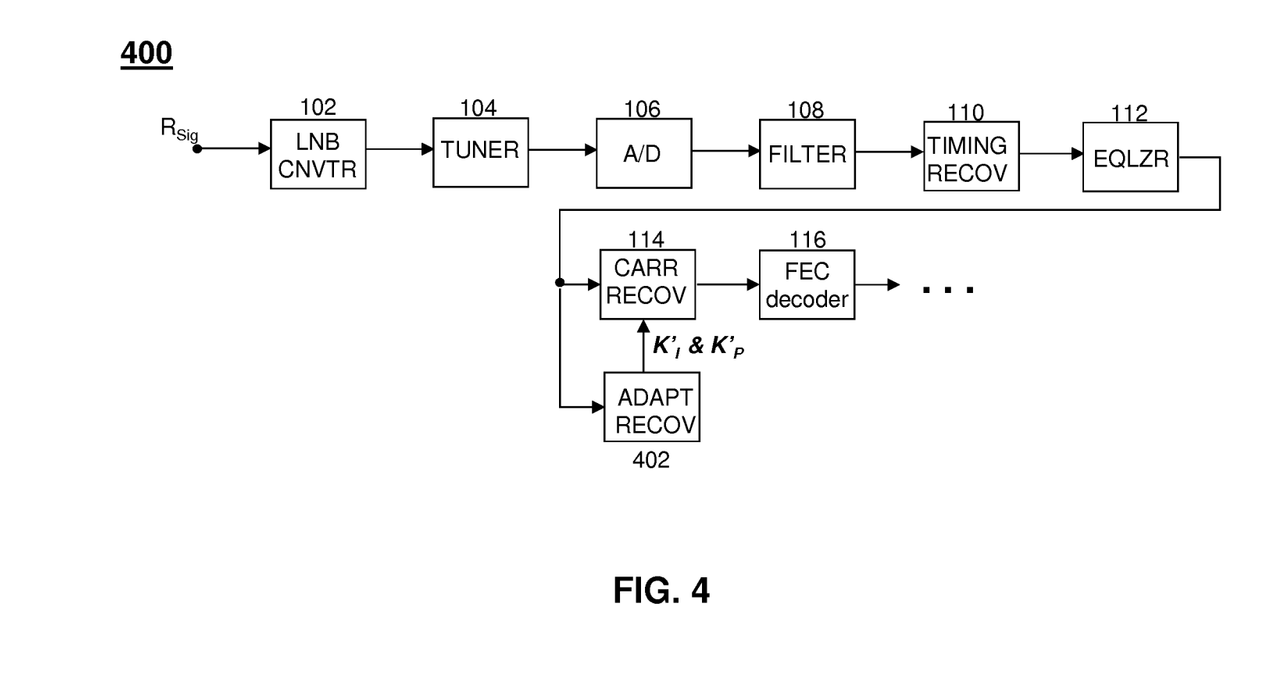
FIG. 4 depicts a high-level functional block diagram of an alternative communication receiver system, in accordance with various aspects of the present disclosure.

In recognition that process 300, in execution, may impact the performance of a communication receiver system in active operation, FIG. 4 depicts a high-level functional block diagram of alternative communication receiver system 400, in accordance with various aspects of the present disclosure. Communication receiver system 400 exploits various features of adaptive PLL 200 and process 300, consistent with the principles disclosed above.

In particular, communication receiver system 400 is configured to employ two carrier recovery loops operating in parallel. As shown in FIG. 4, a main carrier recovery loop 114, which may comprise a conventional PLL, such as PLL 140 described above, is implemented along the main path of the receiver chain while auxiliary carrier recovery loop 402 may be branched off of the input to carrier recovery loop 114.

Auxiliary carrier recovery loop 402 may comprise an implementation such as adaptive PLL 200 and be configured to execute process 300 to optimize tracking performance for the operating conditions that prevail, as described above.

Once the optimization is complete based on either the lapsing of the optimization period or saturation of the adjustment direction change counter, the optimized parameters, namely coefficients K'$_I$ and K'$_P$, are forwarded to main carrier recovery loop 114. The transfer of coefficients K'$_I$ and K'$_P$ values from auxiliary carrier recovery loop 402 to main carrier recovery loop 114 may be achieved gradually over a period of time, such as, for example, as small adjustment steps over time. At the end of the transfer, the parameters of main carrier recovery loop 114 and auxiliary carrier recovery loop 402, as well as recovery performance will be substantially similar, and auxiliary carrier recovery loop 402 can initiate another stage of parameter optimization.

Although the system and process has been thus described with reference to a single carrier modulation scheme, it will be appreciated that the aspects, architectures, and principles disclosed herein are equally applicable to multi-carrier modulations schemes, such as, for example, Orthogonal Frequency Domain Multiplexing (OFDM).

Having thus described the novel concepts and principles of the optimization of carrier recovery performance, it will be apparent to those skilled in the art after reading this detailed disclosure that the foregoing detailed disclosure is intended to be presented by way of example only and is not limiting. Various alterations, improvements, and modifications will occur and are intended to those skilled in the art, though not expressly stated herein. The alterations, improvements, and modifications are intended to be suggested by this disclosure, and are within the spirit and scope of the exemplary aspects of this disclosure. Additionally, the recited order of processing elements or sequences, or the use of numbers, letters, or other designations therefore, is not intended to limit the claimed processes and methods to any order except as can be specified in the claims. Although the above disclosure discusses through various examples what is currently considered to be a variety of useful aspects of the disclosure, it is to be understood that such detail is solely for that purpose, and that the appended claims are not limited to the disclosed aspects, but, on the contrary, are intended to cover modifications and equivalent arrangements that are within the spirit and scope of the disclosed aspects.

What is claimed is:

1. A communication method comprising:
generating an estimated phase error value in a phase lock loop based on a received data signal and an oscillator reference signal;
calculating a phase noise variance based on the estimated phase error value; and
determining whether the calculated phase noise variance is lower than a previously saved phase noise variance;
wherein, upon determining that the calculated phase noise variance is lower than the previously save phase noise variance:
setting the lower phase noise variance as the saved noise variance,
calculating a loop bandwidth value based on the saved, lower phase noise variance,
generating modified loop filter values in accordance with the calculated loop bandwidth value, and
updating the phase lock loop with the modified loop filter values.

2. The method of claim 1, wherein the modified loop filter values comprise a modified integral filter gain value and a modified proportional filter gain value.

3. The method of claim 1 wherein, for subsequent iterations, the loop filter values are incrementally modified along an adjustment direction until the calculated phase noise variance becomes greater than the saved noise variance.

4. The method of claim 3, wherein upon the calculated phase noise variance becomes greater than the saved noise variance, the loop filter values are incrementally modified in an adjustment direction opposite to a prior adjustment direction for subsequent iterations.

5. The method of claim 4, further comprising recording each change in adjustment directions for incremental loop filter value modifications.

6. The method of claim 5, wherein iterative modifications terminate when the recorded changes in adjustment directions exceeds a predetermined threshold and/or upon a lapsing of a predetermined time interval.

7. A communication apparatus, comprising:
a phase lock loop configured to generate an estimated phase error value based on a received data signal and a reference oscillator signal;
a variance module configured to calculate a phase noise variance based on the estimated phase error value; and
a loop bandwidth control module,
wherein, upon determining that the calculated phase noise variance is lower than a previously saved phase noise variance, the loop bandwidth control module:
sets the lower phase noise variance as the saved noise variance,
calculates a loop bandwidth value based on the saved, lower phase noise variance,
generates modified loop filter values in accordance with the calculated loop bandwidth value, and
updates the phase lock loop with the modified loop filter values.

8. The apparatus of claim 7, wherein the modified loop filter values comprise a modified integral filter gain value and a modified proportional filter gain value.

9. The apparatus of claim 7 wherein, for subsequent iterations, the loop filter values are incrementally modified along an adjustment direction until the calculated phase noise variance becomes greater than the saved noise variance.

10. The apparatus of claim 9 wherein, for subsequent iterations, upon the calculated phase noise variance becomes greater than the saved noise variance, the loop filter values are incrementally modified in an adjustment direction opposite to a prior adjustment direction.

11. The apparatus of claim 10, further comprising recording each change in adjustment directions for incremental loop filter value modifications.

12. The apparatus of claim 10, wherein the iterative modifications terminate when the recorded changes in adjustment directions exceeds a predetermined threshold and/or the iterative modifications terminate upon a lapsing of a predetermined time interval.

13. A communication system comprising:
a primary phase lock loop;
a secondary phase lock loop configured to generate an estimated phase error value based on a received data signal and a reference oscillator reference signal, the secondary phase lock loop including:
a variance module configured to calculate a phase noise variance based on the estimated phase error value calculated by the secondary phase lock loop; and
a loop bandwidth control module, wherein, upon determining that the calculated phase noise variance is lower than a previously saved phase noise variance, the loop bandwidth control module:
sets the lower phase noise variance as the saved noise variance,
calculates a loop bandwidth value based on the saved, lower phase noise variance,
generates modified loop filter values in accordance with the calculated loop bandwidth value, and
updates the phase lock loop with the modified loop filter values; and
wherein the modified loop filter values are supplied to the primary phase lock loop.

14. The system of claim 13, wherein the modified loop filter values comprise a modified integral filter gain value and a modified proportional filter gain value.

15. The system of claim 13, wherein, for subsequent iterations, the loop filter values are incrementally modified along an adjustment direction until the calculated phase noise variance becomes greater than the saved noise variance.

16. The system of claim 15 wherein, for subsequent iterations, upon the calculated phase noise variance becomes greater than the saved noise variance, the loop filter values are incrementally modified in an adjustment direction opposite to a prior adjustment direction.

17. The system of claim 16, further comprising recording each change in adjustment directions for incremental loop filter value modifications.

18. The system of claim 17, wherein the iterative modifications terminate when the recorded changes in adjustment directions exceeding a predetermined threshold and/or upon a lapsing of a predetermined time interval.

19. The system of claim 17, wherein the modified loop filter values are supplied to the primary phase lock loop parameters as gradual adjustments over a period of time.

* * * * *